United States Patent
Koganei

(10) Patent No.: US 11,711,247 B2
(45) Date of Patent: Jul. 25, 2023

(54) SIGNAL PROCESSING DEVICE AND TRANSMISSION DEVICE

(71) Applicant: FUJITSU LIMITED, Kawasaki (JP)

(72) Inventor: Yohei Koganei, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/828,082

(22) Filed: May 31, 2022

(65) Prior Publication Data

US 2023/0069705 A1 Mar. 2, 2023

(30) Foreign Application Priority Data

Aug. 24, 2021 (JP) ................ 2021-136001

(51) Int. Cl.
*H04L 27/06* (2006.01)
*H04L 25/06* (2006.01)

(52) U.S. Cl.
CPC ................. *H04L 25/067* (2013.01)

(58) Field of Classification Search
CPC ..... H04L 1/0044; H04L 25/067; H04L 1/005; H04L 27/38; H04L 1/0045; H04L 1/0053; G11C 16/08; G11C 16/0483; H03M 13/118; H03M 13/25; H03M 13/152
USPC ....................................... 375/340
See application file for complete search history.

(56) References Cited

U.S. PATENT DOCUMENTS

| | | | |
|---|---|---|---|
| 9,059,738 B2* | 6/2015 | Chung | G06F 11/1012 |
| 2002/0110188 A1* | 8/2002 | Ohmori | H04L 25/03038 |
| | | | 375/232 |
| 2010/0287449 A1 | 11/2010 | Kubo et al. | |
| 2020/0145149 A1 | 5/2020 | Oveis Gharan et al. | |
| 2020/0177307 A1 | 6/2020 | Pan | |
| 2021/0217476 A1* | 7/2021 | Shirakawa | G11C 16/10 |
| 2021/0288721 A1* | 9/2021 | Nakamura | H03M 13/458 |

FOREIGN PATENT DOCUMENTS

| | | |
|---|---|---|
| JP | 2009-290657 A | 12/2009 |
| JP | 2010-263555 A | 11/2010 |
| JP | 2016-192747 A | 11/2016 |

* cited by examiner

*Primary Examiner* — Khai Tran
(74) *Attorney, Agent, or Firm* — Fujitsu Patent Center

(57) ABSTRACT

A signal processing device includes: a memory; and a processor coupled to the memory and configured to: perform soft decision of a value of, among bit strings, a predetermined bit string encoded with a soft decision code from a symbol assigned to, according to each value of the bit strings, the bit strings having been subject to encoding of an outer code with a turbo product code and encoding of an inner code with the soft decision code; decode the predetermined bit string with the soft decision code on a basis of a result of the soft decision; individually perform, from the symbol, the soft decision of a value of each bit string other than the predetermined bit string among the bit strings; and decode the bit strings with the turbo product code on a basis of a result of the decoding and a result of the soft decision.

12 Claims, 9 Drawing Sheets

SIGNAL PROCESSING DEVICE AND TRANSMISSION DEVICE

CROSS-REFERENCE TO RELATED APPLICATION

This application is based upon and claims the benefit of priority of the prior Japanese Patent Application No. 2021-136001, filed on Aug. 24, 2021, the entire contents of which are incorporated herein by reference.

FIELD

The present case is related to a signal processing device and a transmission device.

BACKGROUND

A transmission device that transmits optical signals is in need of, for example, high error-correcting performance and low power consumption. The transmission device on the transmitting side encodes a data signal with an error-correcting code, and performs symbol mapping by a multi-level modulation method such as 16 quadrature amplitude modulation (QAM). The transmission device on the receiving side receives the symbol, and decodes it into the data signal before the encoding.

Japanese Laid-open Patent Publication No. 2009-290657 is disclosed as related art.

SUMMARY

According to an aspect of the embodiments, a signal processing device includes: a memory; and a processor coupled to the memory and configured to: perform soft decision of a value of, among a plurality of bit strings, a predetermined bit string encoded with a soft decision code from a symbol assigned to, according to each value of the plurality of bit strings, the plurality of bit strings having been subject to encoding of an outer code with a turbo product code and encoding of an inner code with the soft decision code; decode the predetermined bit string with the soft decision code on a basis of a result of the soft decision; individually perform, from the symbol, the soft decision of a value of each bit string other than the predetermined bit string among the plurality of bit strings; and decode the plurality of bit strings with the turbo product code on a basis of a result of the decoding and a result of the soft decision.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The transmission device performs encoding processing and decoding processing of each of an outer code and an inner code. For example, a hard decision code such as a Bose-Chaudhuri-Hocquenghem (BCH) code is used for the outer code, and a soft decision code such as a Low-Density Parity-Check (LDPC) code is used for the inner code.

While the error-correcting performance of the soft decision code is higher than the error-correcting performance of the hard decision code, an error floor in a case of using the soft decision code is lower than an error floor in a case of using the hard decision code. Furthermore, power consumption in the case of using the hard decision code is lower than power consumption in the case of using the soft decision code.

For example, in a case of using multi-level coding (MLC) for the inner code, it is sufficient if encoding and decoding based on the soft decision code are performed on only a part of bit strings on the lower side among multiple bit strings corresponding to the multi-level modulation method of the data signal so that the encoding and the decoding of other bit strings on the upper side are omitted, thereby reducing the power consumption.

However, the higher the multi-level degree of the multi-level modulation method, the more bit strings are not subject to the encoding and the decoding based on the soft decision code, whereby an error rate may increase. Meanwhile, while it is conceivable to suppress the increase in the error rate by increasing redundancy of the outer code and the inner code and enhancing the error-correcting performance, as the redundancy increases, an occupied band of the error-correcting code increases to decrease a main signal band, and also the improvement in the error-correcting performance slows down. Therefore, there is a problem that it is difficult to effectively improve the error-correcting performance from the viewpoint of redundancy.

In view of the above, an object of the present case is to provide a signal processing device and a transmission device with improved error-correcting performance.

Configuration of Transmission System

Figure 1:
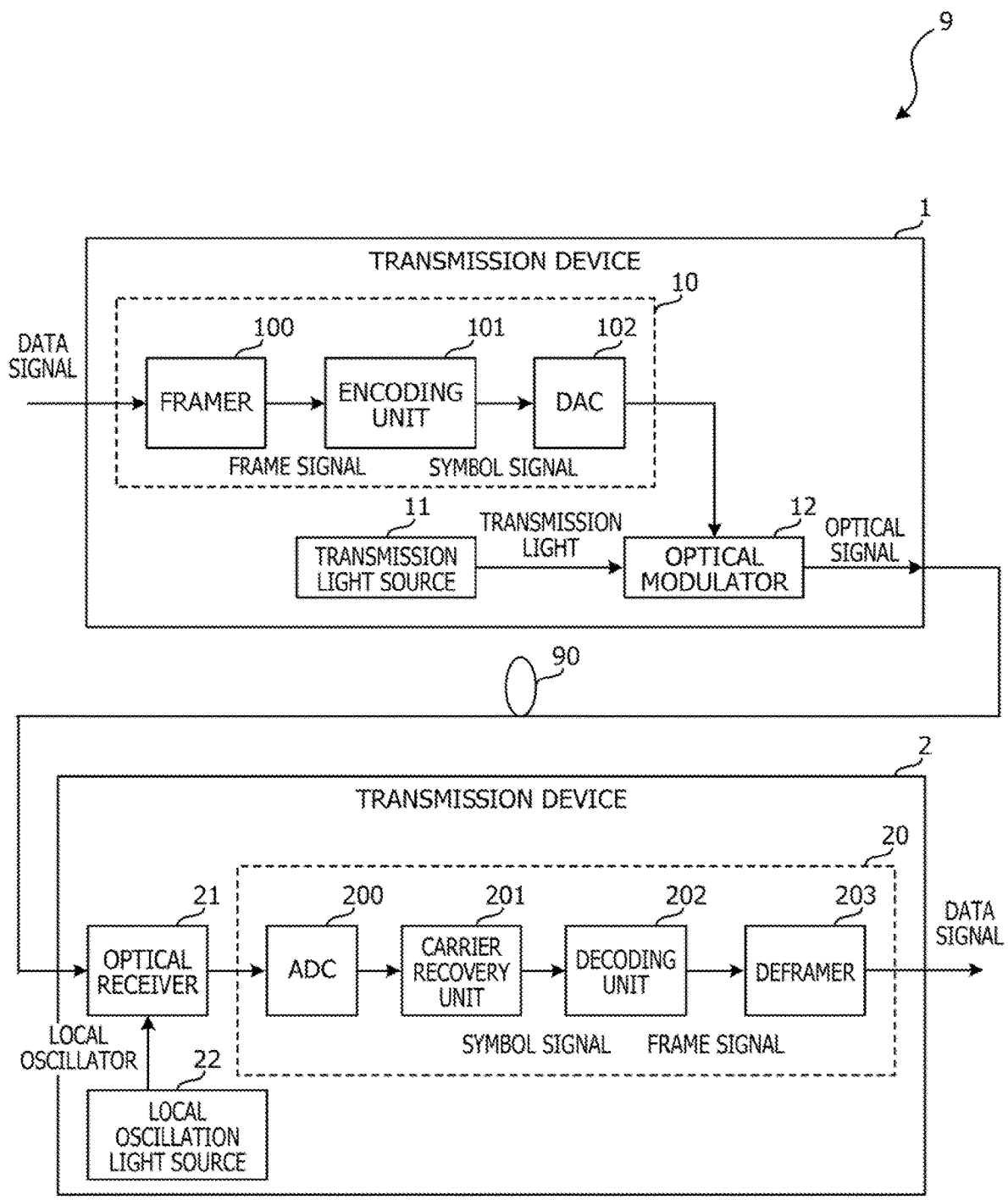
FIG. 1 is a configuration diagram illustrating an exemplary transmission system.

FIG. 1 is a configuration diagram illustrating an example of a transmission system 9. The transmission system 9 performs, for example, digital coherent optical transmission. Note that, in the present example, illustration and description of a configuration related to transmission for each polarization will be omitted.

The transmission system 9 includes a transmission device 1 on the transmitting side and a transmission device 2 on the receiving side. The transmission device 1 on the transmitting side receives data signals, such as Ethernet (registered trademark, the same applies hereinafter) signals, from a client network (not illustrated) to convert them into optical signals, and transmits them to the transmission device 2 on the receiving side via a transmission line 90, such as an optical fiber. The transmission device 2 on the receiving side converts the optical signals input from the transmission line 90 into data signals, and transmits them to a client network (not illustrated).

The transmission device 1 on the transmitting side includes a signal processing circuit 10, a transmission light source 11, and an optical modulator 12. Furthermore, the transmission device 2 on the receiving side includes a signal processing circuit 20, an optical receiver 21, and a local oscillation light source 22. Note that the transmission devices 1 and 2 may have both of the configurations on the transmitting side and the receiving side described above so that bidirectional transmission becomes available for each other.

The signal processing circuits 10 and 20 are implemented by, for example, a digital signal processor (DSP) or the like. The signal processing circuit 10 on the transmitting side includes a framer 100, an encoding unit 101, and a digital-to-analog converter (DAC) 102. Note that the signal processing circuit 10 on the transmitting side is an example of a signal processing device.

The framer 100 receives a data signal and generates a frame signal from the data of the data signal. The frame signal is input from the framer 100 to the encoding unit 101.

The encoding unit 101 performs encoding of an outer code on the frame signal, treats the frame signal as a plurality of bit strings for each bit level from the MSB to the LSB, and performs encoding of an inner code by multi-level coding.

Furthermore, the encoding unit 101 performs, on the plurality of bit strings, a symbol mapping process of assigning a symbol corresponding to the value of each bit string. The encoding unit 101 assigns, to the bit string, a symbol in a constellation corresponding to the multi-level modulation method such as 16QAM, for example. The symbol generated by the symbol mapping process is input from the encoding unit 101 to the DAC 102. The symbol is transmitted as a symbol signal including electric field information of the optical signal output from the optical modulator 12. Note that details of the encoding unit 101 will be described later.

The DAC 102 converts the symbol signal from a digital signal to an analog signal. The symbol signal converted into the analog signal is input to the optical modulator 12.

The transmission light source 11 outputs transmission light to the optical modulator 12. The transmission light source 11 is implemented by, for example, a laser diode.

The optical modulator 12 is implemented by, for example, a Mach—Zehnder interferometer or the like. The optical modulator 12 performs optical modulation on the transmission light on the basis of the symbol signal. The optical signal generated by the optical modulation is output from the optical modulator 12 to the transmission line 90. The optical signal is input from the transmission line 90 to the transmission device 2 on the receiving side.

In the transmission device 2 on the receiving side, the optical signal is input from the transmission line 90 to the optical receiver 21. Furthermore, a local oscillator is input from the local oscillation light source 22 to the optical receiver 21. Note that the optical receiver 21 is an example of a reception unit that receives the symbol signal.

The local oscillation light source 22 is implemented by, for example, a laser diode. A central wavelength of the local oscillator corresponds to a central wavelength of the optical signal.

The optical receiver 21 is implemented by, for example, an optical front end and the like including a 90-degree hybrid circuit, a photodiode, and the like. The optical receiver 21 detects the optical signal by the local oscillator, and converts it into an electrical analog signal using a photodiode or the like. The analog signal is input from the optical receiver 21 to the signal processing circuit 20.

The signal processing circuit 20 on the receiving side includes an analog-to-digital converter (ADC) 200, a carrier recovery unit 201, a decoding unit 202, and a deframer 203.

The ADC 200 converts an analog signal into a digital signal. The digital signal includes electric field information of an optical signal. The digital signal is input from the ADC 200 to the carrier recovery unit 201.

The carrier recovery unit 201 reproduces a symbol signal from the electric field information of the optical signal indicated by the digital signal. The carrier recovery unit 201 is implemented by, for example, a digital filter or the like. The symbol signal is input from the carrier recovery unit 201 to the decoding unit 202.

The decoding unit 202 performs, on the symbol signal, decoding of an inner code by two-step decoding corresponding to multi-level coding, and further performs decoding of an outer code. A frame signal is reproduced by the decoding of the symbol signal. The frame signal is input from the decoding unit 202 to the deframer 203.

The deframer 203 reproduces a data signal from the frame signal. The data signal is transmitted from the deframer 203 to a client network (not illustrated).

Encoding Unit and Decoding Unit of Comparative Example

Figure 2:
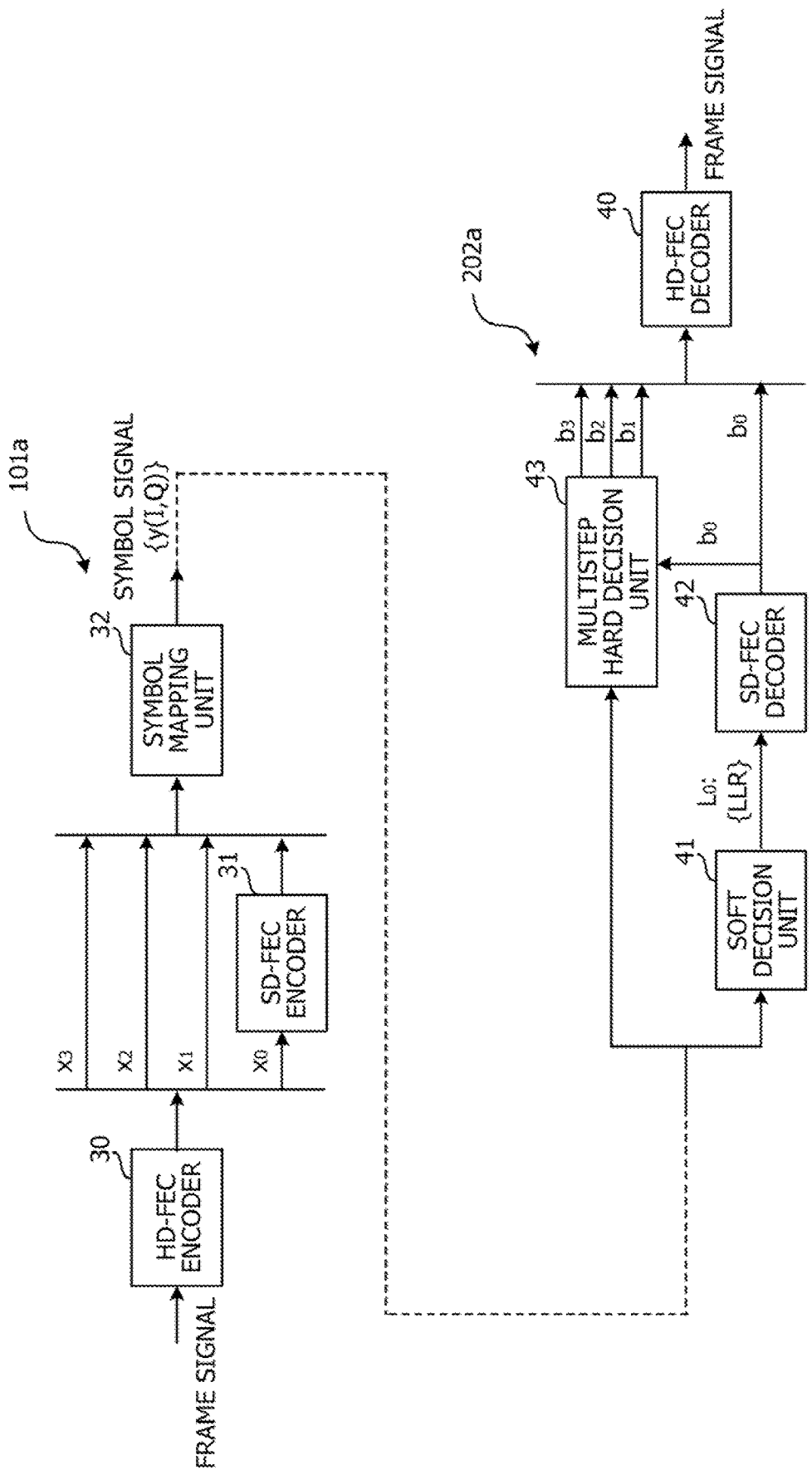
FIG. 2 is a configuration diagram illustrating an exemplary encoding unit and decoding unit according to a comparative example.

FIG. 2 is a configuration diagram illustrating an example of an encoding unit 101*a* and a decoding unit 202*a* according to a comparative example. In the present example, the encoding unit 101*a* is provided in place of the encoding unit 101, and the decoding unit 202*a* is provided in place of the decoding unit 202. Note that, although a case of using 16QAM as a multi-level modulation method will be exemplified in the present example and following embodiments, the multi-level modulation method is not limited.

The encoding unit 101*a* includes a hard decision (HD)-forward error correction (FEC) encoder 30, a soft decision (SD)-FEC encoder 31, and a symbol mapping unit 32. Furthermore, the decoding unit 202*a* includes an HD-FEC decoder 40, a soft decision unit 41, an SD-FEC decoder 42, and a multistep hard decision unit 43.

The HD-FEC encoder 30 and the HD-FEC decoder 40 performs, on a frame signal, encoding and decoding of an outer code, respectively. For example, a hard decision code such as a BCH product code is used as the outer code.

The HD-FEC encoder 30 performs encoding using the BCH product code on the frame signal. The HD-FEC encoder 30 inserts the HD-FEC parity bit generated by the encoding into a predetermined area of the frame signal. The HD-FEC encoder 30 divides the frame signal into four bit strings $x_0$ to $x_3$, and outputs them.

The number of the bit strings $x_0$ to $x_3$ is determined according to the multi-level modulation method. Since 16QAM is used as the multi-level modulation method in the present example, the frame signal is divided into four bit strings $x_0$ to $x_3$ and processed. Here, the bit string $x_0$ is the least significant bit (LSB), and $x_3$ is the most significant bit (MSB).

Multi-level coding is used for encoding of an inner code. In the multi-level coding, each of the bit strings $x_0$ to $x_3$ is individually subject to encoding and decoding.

The SD-FEC encoder 31 and the SD-FEC decoder 42 perform, on the bit string $x_0$ of the LSB among the bit strings $x_0$ to $x_3$, encoding and decoding of the inner code, respectively. While a soft code such as a LDPC code is used as the inner code, for example, it is not limited to this.

The SD-FEC encoder 31 performs encoding using the LDPC code on the bit string $x_0$. The SD-FEC encoder 31 inserts the SD-FEC parity bit generated by the encoding into a predetermined area of the bit string $x_0$. The SD-FEC encoder 31 outputs the encoded bit string $x_0$ to the symbol mapping unit 32. Furthermore, other bit strings $x_1$ to $x_3$ are output from the HD-FEC encoder 30 to the symbol mapping unit 32 at the timing same as the output timing of the bit string $x_0$.

The symbol mapping unit 32 assigns, to the bit strings $x_0$ to $x_3$, symbols corresponding to the values thereof. Exemplary symbol assignment will be described below.

Figure 3:
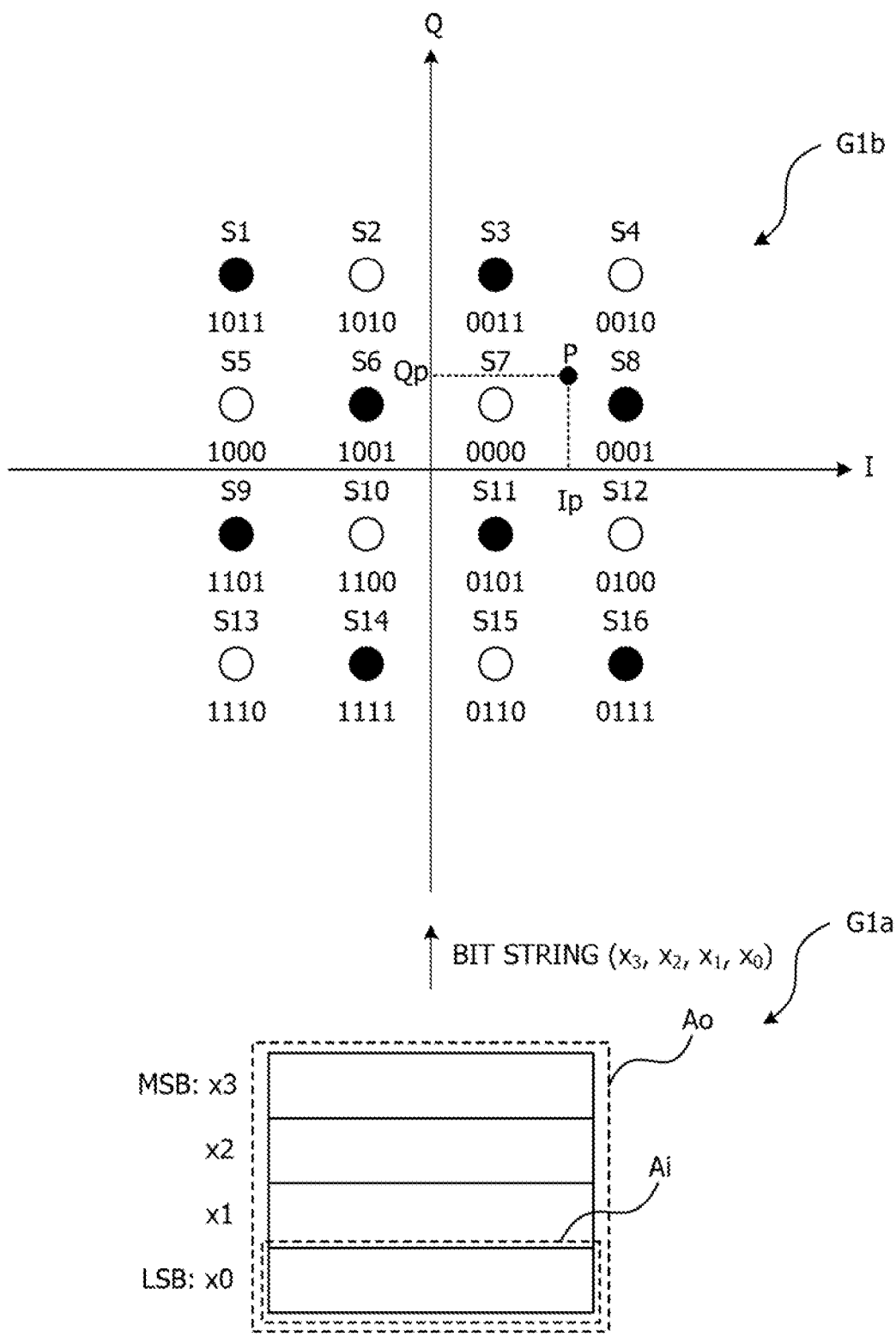
FIG. 3 is a diagram illustrating exemplary symbol mapping in a case of 16QAM.

FIG. 3 is a diagram illustrating exemplary symbol mapping in a case of 16QAM. A reference sign G1a indicates a configuration of the bit strings $x_0$ to $x_3$ in the frame signal, and a reference sign G1b indicates a constellation (signal points arrangement). In the constellation, the I-axis represents intensity of an in-phase component of the symbol signal, and the Q-axis represents intensity of a quadrature-phase component of the symbol signal.

An area Ao of the bit strings $x_0$ to $x_3$ is a target area for encoding and decoding of the outer code, and an area Ai of the bit string $x_0$ is a target area for encoding and decoding of the inner code. The symbol mapping unit 32 assigns symbols S1 to S16 in the constellation from individual values of the bit strings $x_0$ to $x_3$ after the encoding. In the drawing of FIG. 3, the individual values of the bit strings $x_0$ to $x_3$ to be assigned are indicated as 4-bit binary values under the individual symbols S1 to S16.

For example, in a case where a value of the bit string $x_3$ is 1, a value of the bit string $x_2$ is 0, a value of the bit string $x_1$ is 1, and a value of the bit string $x_0$ is 1, the symbol S1 corresponding to the binary value "1011" is assigned. Furthermore, for example, in a case where a value of the bit string $x_3$ is 0, a value of the bit string $x_2$ is 1, a value of the bit string $x_1$ is 0, and a value of the bit string $x_0$ is 0, the symbol S12 corresponding to the binary value "0100" is assigned. Note that the symbols S2, S4, S5, S7, S10, S12, S13, and S15 in which a value of the bit string $x_0$ to be assigned is 0 are indicated by white circles, and the symbols S1, S3, S6, S8, S9, S11, S14, and S16 to be assigned to a binary value in which a value of the bit string $x_0$ to be assigned is 1 are indicated by black circles.

A waveform of the optical signal is distorted due to, for example, a non-linear optical effect generated in the transmission line 90 and the like. Accordingly, the symbol signal output from the carrier recovery unit 201 may not match any of the coordinates of the symbols S1 to S16 in the constellation, as with a signal point P, for example. Therefore, the decoding unit 202a calculates each value of the bit strings $x_0$ to $x_3$ on the basis of the coordinates (Ip, Qp) of the signal point P.

Figure 4:
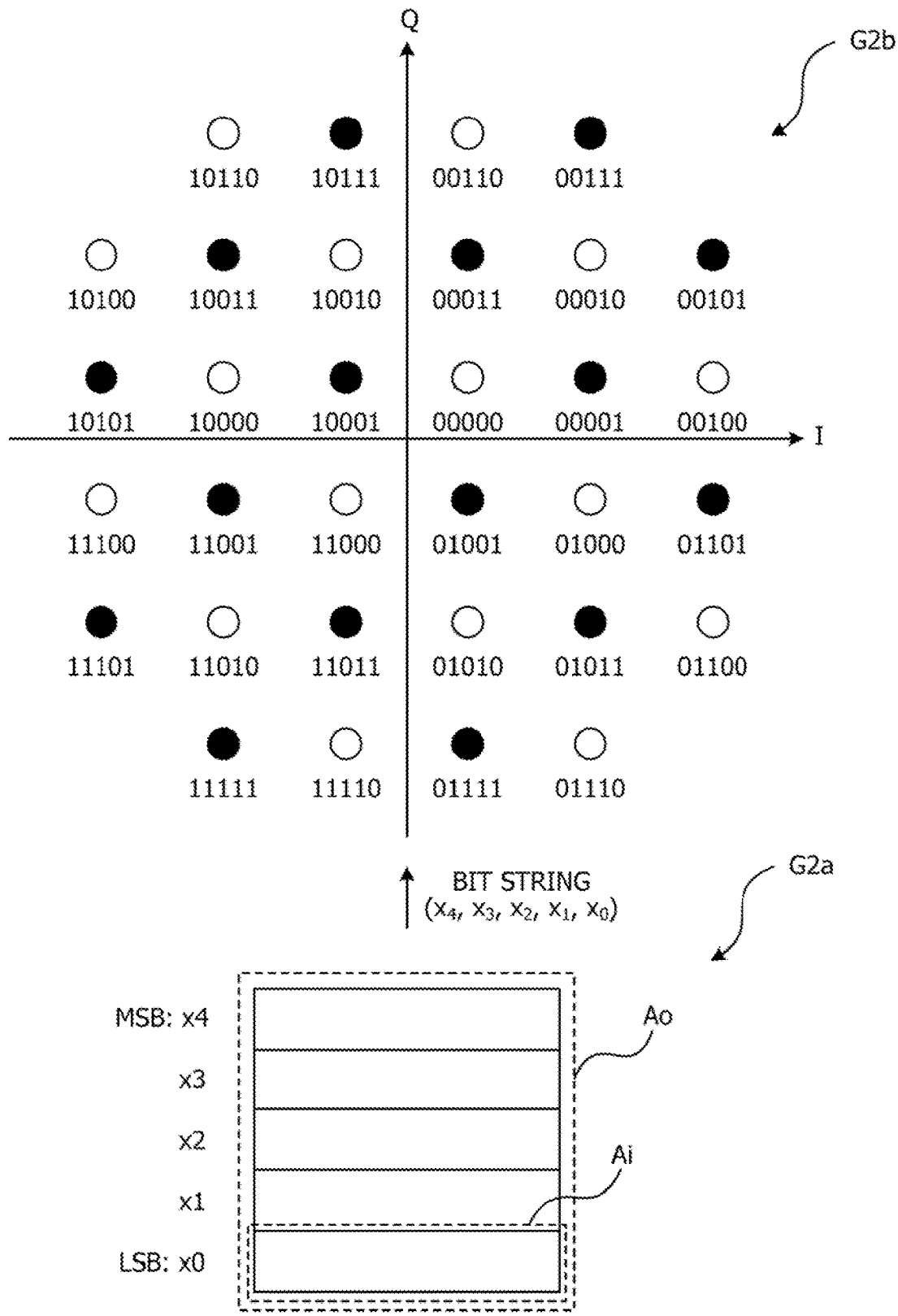
FIG. 4 is a diagram illustrating exemplary symbol mapping in a case of 32QAM.

FIG. 4 is a diagram illustrating exemplary symbol mapping in a case of 32QAM. In this case, the frame signal is five bit strings $x_0$ to $x_4$. A reference sign G1a indicates a configuration of the bit strings $x_0$ to $x_4$ in the frame signal, and a reference sign G2b indicates a constellation. Note that descriptions of contents common to FIG. 3 will be omitted.

The area Ao of the bit strings $x_0$ to $x_4$ is a target area for encoding and decoding of the outer code, and the area Ai of the bit string $x_0$ is a target area for encoding and decoding of the inner code. In a similar manner to the case of 16QAM, the symbol mapping unit 32 assigns symbols in the constellation according to individual values of the bit strings $x_0$ to $x_4$ after the encoding.

Referring to FIG. 2 again, a symbol signal indicating coordinates y (I, Q) of a signal point in an I-Q plane is input to the decoding unit 202a. The soft decision unit 41, the SD-FEC decoder 42, and the multistep hard decision unit 43 perform a process of inner code decoding on the bit strings $x_0$ to $x_3$.

The soft decision unit 41 carries out soft decision of the value of the bit string $x_0$ of the LSB from the coordinates y (I, Q) of the symbol signal. The soft decision unit 41 outputs a log-likelihood ratio (LLR) $L_0$ of the bit string $x_0$ to the SD-FEC decoder 42 as a result of the soft decision. Note that the soft decision unit 41 is an example of a first soft decision unit that carries out soft decision of a predetermined value of the bit string $x_0$ encoded by a soft decision code.

[Formula 1]

$$L_0 = \log_2 \frac{P(x_0 = 0 \mid y)}{P(x_0 = 1 \mid y)} \quad (1)$$

As an example, the soft decision unit 41 calculates the log-likelihood ratio $L_0$ according to the formula (1) set out above. In the formula (1), $P(x_0=0|y)$ indicates a probability that the value of the bit string $x_0$ is 0 on the premise of the coordinates y (I, Q) of the signal point, and $P(x_0=1|y)$ indicates a probability that the value of the bit string $x_0$ is 1 in that case. The soft decision unit 41 calculates the probabilities $P(x_0=0|y)$ and $P(x_0=1|y)$ from, for example, a distance between the coordinates y (I, Q) of the signal point and the symbol in the constellation and the like.

The SD-FEC decoder 42 decodes the bit string $x_0$ by the SD-FEC parity bit on the basis of the log-likelihood ratio $L_0$. The SD-FEC decoder 42 calculates a hard decision value $b_0$ of the bit string $x_0$ from the log-likelihood ratio $L_0$ according to a belief propagation algorithm based on the LDPC code. The SD-FEC decoder 42 outputs the hard decision value $b_0$ of the bit string $x_0$ to the multistep hard decision unit 43 and the HD-FEC decoder 40 as a result of the decoding.

The multistep hard decision unit 43 individually calculates each of hard decision values $b_1$ to $b_3$ of the bit strings $x_1$ to $x_3$ from the coordinates y (I, Q) of the symbol signal on the basis of the hard decision value $b_0$ of the bit string $x_0$ input from the SD-FEC decoder 42.

[Formula 2]

$$b_j = \begin{cases} 0, P(x_j = 0 \mid y, b_0) \geq P(x_j = 1 \mid y, b_0) \\ 1, P(x_j = 1 \mid y, b_0) < P(x_j = 0 \mid y, b_0) \end{cases} \quad (2)$$

As an example, the multistep hard decision unit 43 calculates each of the hard decision values $b_1$ to $b_3$ of the bit strings $x_1$ to $x_3$ according to the formula (2) set out above. In the formula (2), j indicates 1, 2, or 3 (bit level), $P(x_j=0|y, b_0)$ indicates a probability that the value of the bit string $x_0$ is 0 on the premise of the coordinates y (I, Q) of the signal point and the hard decision value $b_0$ of the bit string $x_0$, and $P(x_j=1|y, b_0)$ indicates a probability that the value of the bit string $x_0$ is 1 in that case.

the multistep hard decision unit 43 calculates the hard decision value $b_j$ of the bit string $x_j$ as 0 in a case where the probability $P(x_j=0|y, b_0)$ is equal to or higher than the probability $P(x_j=1|y, b_0)$, and calculates the hard decision value $b_j$ of the bit string $x_j$ as 1 in a case where the probability $P(x_j=0|y, b_0)$ is higher than the probability $P(x_j=1|y, b_0)$. Here, the multistep hard decision unit 43 calculates the probabilities $P(x_j=0|y, b_0)$ and $P(x_j=1|y, b_0)$ from, for example, a distance between the coordinates y (I, Q) of the signal point and the symbol in the constellation and the like.

In a case where the hard decision value $b_0$ is 0, the multistep hard decision unit 43 calculates the probabilities $P(x_j=0|y, b_0)$ and $P(x_j=1|y, b_0)$ from a distance between the coordinates y (I, Q) of the signal point and the symbols S2, S4, S5, S7, S10, S12, S13, and S15 of white circles in FIG. 3 and the like. Furthermore, in a case where the hard decision value $b_0$ is 1, the multistep hard decision unit 43 calculates the probabilities $P(x_j=0|y, b_0)$ and $P(x_j=1|y, b_0)$ from a distance between the coordinates y (I, Q) of the signal point and the symbols S1, S3, S6, S8, S9, S11, S14, and S16 of black circles in FIG. 3 and the like.

The multistep hard decision unit 43 outputs each of the hard decision values $b_1$ to $b_3$ of the bit strings $x_1$ to $x_3$ to the HD-FEC decoder 40 as a result of the hard decision of the bit strings $x_1$ to $x_3$.

The HD-FEC decoder 40 decodes the bit strings $x_0$ to $x_3$ by the HD-FEC parity bit on the basis of the hard decision values $b_0$ to $b_3$ of the bit strings $x_0$ to $x_3$. The HD-FEC decoder 40 corrects errors in the bit strings $x_0$ to $x_3$ by calculating a syndrome on the basis of a generator polynomial. The HD-FEC decoder 40 outputs, as a frame signal, the bit strings $x_0$ to $x_3$ to the deframer 203 in a subsequent stage.

As described above, in a case where the multi-level coding is used for the inner code, it is sufficient if the encoding and the decoding based on the soft decision code is performed only on the bit string $x_0$ of the LSB so that the encoding and the decoding of other bit strings $x_1$ to $x_3$ are omitted, thereby reducing the power consumption.

However, the higher the multi-level degree of the multi-level modulation method, the more bit strings are not subject to the encoding and the decoding based on the soft decision code, whereby an error rate may increase. Meanwhile, while it is conceivable to suppress the increase in the error rate by increasing redundancy of the outer code and the inner code and enhancing the error-correcting performance, as the redundancy increases, an occupied band of the error-correcting code increases to decrease a main signal band, and also the improvement in the error-correcting performance slows down. Therefore, there is a problem that it is difficult to effectively improve the error-correcting performance from the viewpoint of redundancy.

(Encoding Unit and Decoding Unit of First Embodiment)

Figure 5:
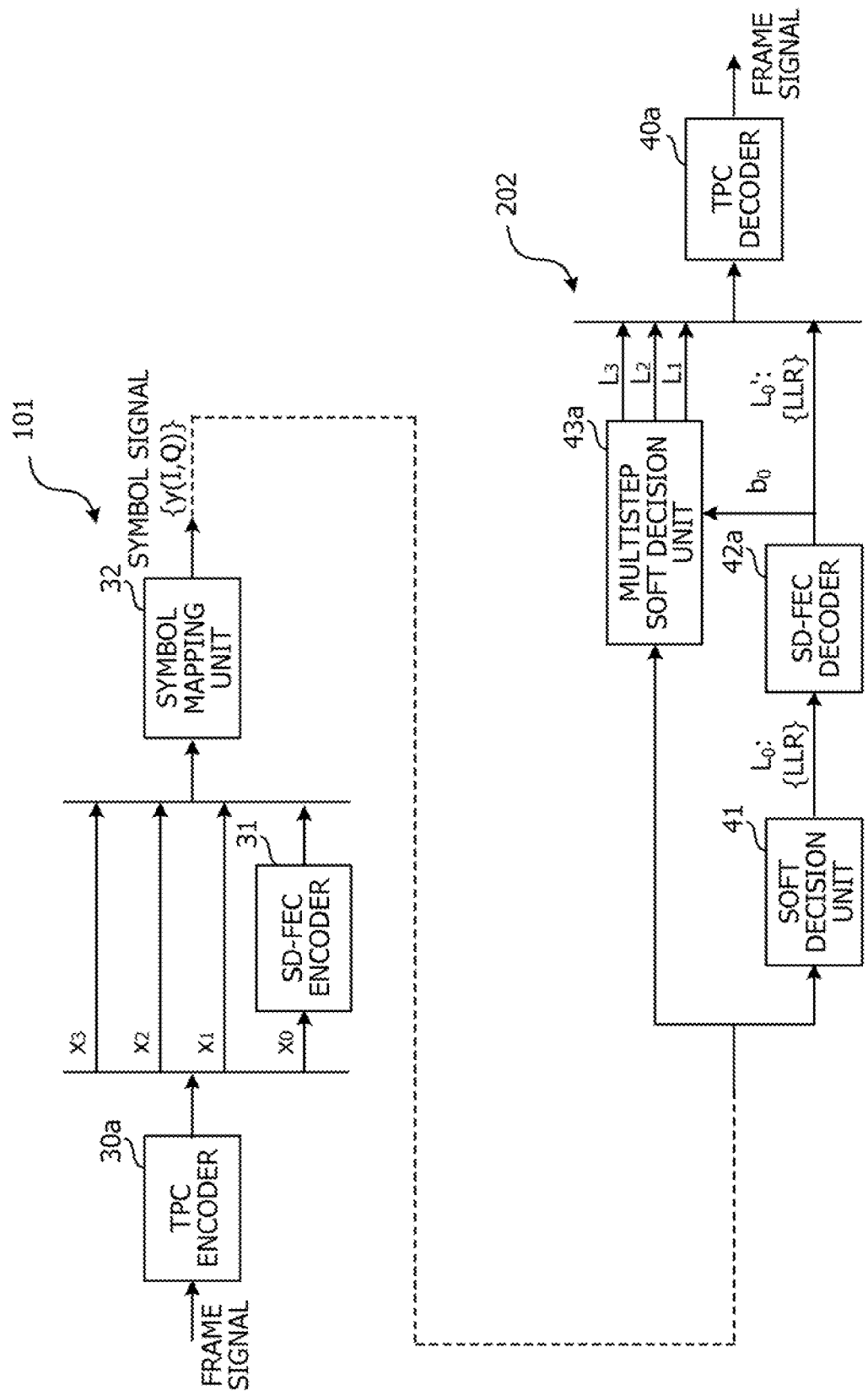
FIG. 5 is a configuration diagram illustrating an encoding unit and a decoding unit according to a first embodiment.

FIG. 5 is a configuration diagram illustrating an encoding unit 101 and a decoding unit 202 according to a first embodiment. In FIG. 5, components common to those in FIG. 2 are denoted by the same reference signs, and descriptions thereof will be omitted.

The encoding unit 101 includes a turbo product code (TPC) encoder 30a, an SD-FEC encoder 31, and a symbol mapping unit 32. The decoding unit 202 includes a TPC decoder 40a, a soft decision unit 41, an SD-FEC decoder 42a, and a multistep soft decision unit 43a.

In the present example, a turbo product code (same as block turbo code) is used to perform encoding and decoding of an outer code. The TPC encoder 30a performs encoding based on the turbo product code on a frame signal. The TPC encoder 30a inserts a TPC parity bit generated by the encoding into a predetermined area of the frame signal. The TPC encoder 30a divides the frame signal into four bit strings $x_0$ to $x_3$, and outputs them.

The SD-FEC decoder 42a decodes the bit string $x_0$ by the TPC parity bit on the basis of a log-likelihood ratio $L_0$, and outputs, to the multistep soft decision unit 43a, a hard decision value $b_0$ of the bit string $x_0$ as a result of the decoding.

Furthermore, the SD-FEC decoder 42a calculates a log-likelihood ratio $L_0'$ of the bit string $x_0$ of the LSB after the decoding on the basis of the hard decision value $b_0$. The SD-FEC decoder 42a outputs the log-likelihood ratio $L_0'$ to the TPC decoder 40a. Note that the SD-FEC decoder 42a is an example of a first decoding unit that decodes the bit string $x_0$ with a soft decision code (e.g., LDPC code) on the basis of a soft decision result of the soft decision unit 41. Furthermore, the log-likelihood ratio $L_0'$ is an example of a first log-likelihood ratio.

[Formula 3]

$$L_j = \log_2 \frac{P(x_j = 0 | y, b_0)}{P(x_j = 1 | y, b_0)} \quad (3)$$

The multistep soft decision unit 43a individually calculates each of log-likelihood ratios $L_1$ to $L_3$ of the bit strings $x_1$ to $x_3$ according to the formula (3) set out above on the basis of the hard decision value $b_0$ of the bit string $x_0$ input from the SD-FEC decoder 42a and the coordinates y (I, Q) of the symbol signal. In the formula (3), the probabilities $P(x_j=0|y, b_0)$ and $P(x_j=1|y, b_0)$ and the coordinates y (I, Q) of the signal point are as described above.

The multistep soft decision unit 43a outputs the log-likelihood ratios $L_1$ to $L_3$ of the bit strings $x_1$ to $x_3$ to the TPC decoder 40a. Note that the multistep soft decision unit 43a is an example of a second soft decision unit that individually carries out soft decision of each of the values of the bit strings $x_1$ to $x_3$ other than the bit string $x_0$ of the LSB from the symbol signal. Furthermore, the log-likelihood ratios $L_1$ to $L_3$ are examples of a second log-likelihood ratio.

The TPC decoder 40a decodes the bit strings $x_0$ to $x_3$ with the turbo product code on the basis of the log-likelihood ratios $L_0$ to $L_3$ of the bit strings $x_0$ to $x_3$. The TPC decoder 40a is an example of a second decoding unit that decodes the bit strings $x_0$ to $x_3$ with the turbo product code on the basis of the result of the decoding by the SD-FEC decoder 42a and the result of the soft decision by the multistep soft decision unit 43a.

As described above, in the present example, the TPC encoder 30a and the TPC decoder 40a are used for the encoding and the decoding of the outer code of the bit strings $x_0$ to $x_3$ instead of the HD-FEC encoder 30 and the HD-FEC decoder 40 in the comparative example. Accordingly, the error-correcting performance improves as described below.

(Improvement in Error-Correcting Performance)

Figure 6:
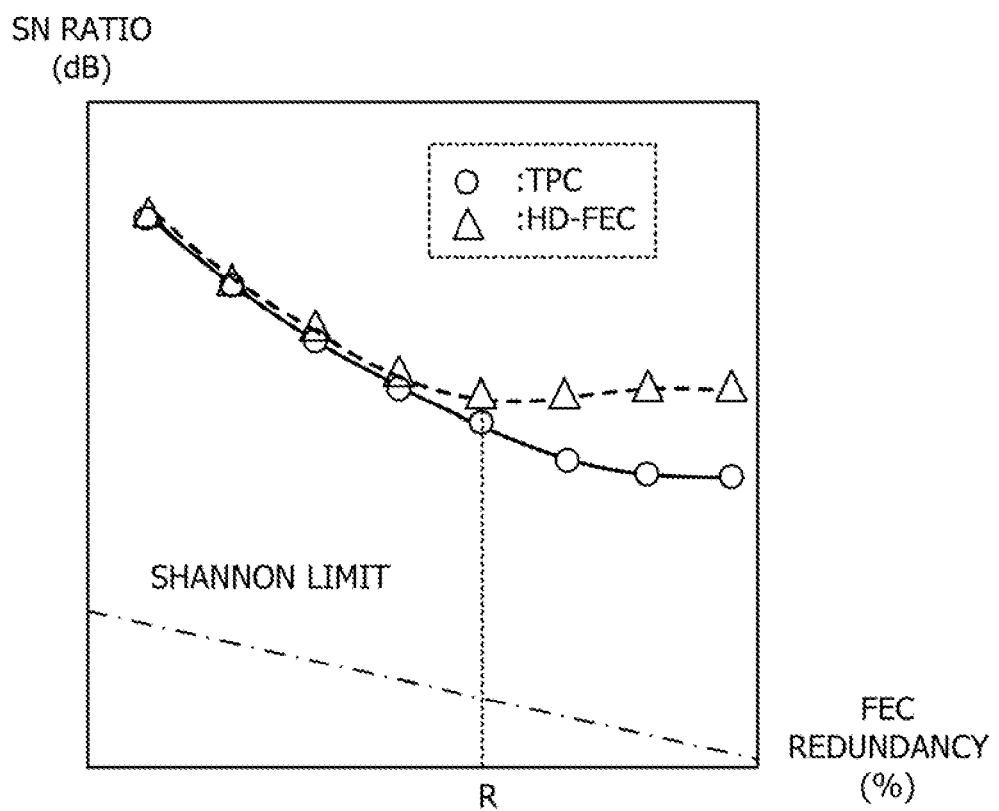
FIG. 6 is a graph of a simulation result indicating an example of improvement in error-correcting performance based on a turbo product code in the case of 16QAM.

FIG. 6 is a graph of a simulation result indicating an example of improvement in the error-correcting performance based on the turbo product code in the case of 16QAM. The horizontal axis of the graph represents FEC redundancy (%) of the bit strings $x_0$ to $x_3$. Furthermore, the vertical axis of the graph represents a signal-to-noise (SN)

ratio (dB) to serve as a threshold value for setting an error rate of an optical signal to $10^{-15}$ or less.

Here, the FEC redundancy is a total value of both the LDPC code of the inner code and the turbo product code (first embodiment) or the HD-FEC (comparative example) of the outer code. Furthermore, a transmission line 90 is assumed to be additive white Gaussian noise (AWGN) communication channel. Note that the symbol mapping and the frame signal are as illustrated in FIG. 3.

The circles represent SN ratios in a case of using the turbo product code (first embodiment) as the outer code. The triangular marks represent SN ratios in a case of using the HD-FEC (comparative example) as the outer code. Furthermore, the dot-and-dash line represents a change in the SN ratio with respect to the FEC redundancy based on the Shannon limit. Here, the redundancy of the turbo product code and the redundancy of the HD-FEC (BCH product code) are both 4.4(%).

As can be seen from FIG. 6, in the case of the turbo product code, as the FEC redundancy increases, the SN ratio decreases to approach the Shannon limit. On the other hand, in the case of the HD-FEC, while the SN ratio decreases to approach the Shannon limit as the FEC redundancy increases in the range of FEC redundancy predetermined value R, the SN ratio does not decrease but slightly increases in the range of FEC redundancy>predetermined value R.

As described above, with the turbo product code used as the outer code, the error-correcting performance of the transmission device 2 improves.

Figure 7:
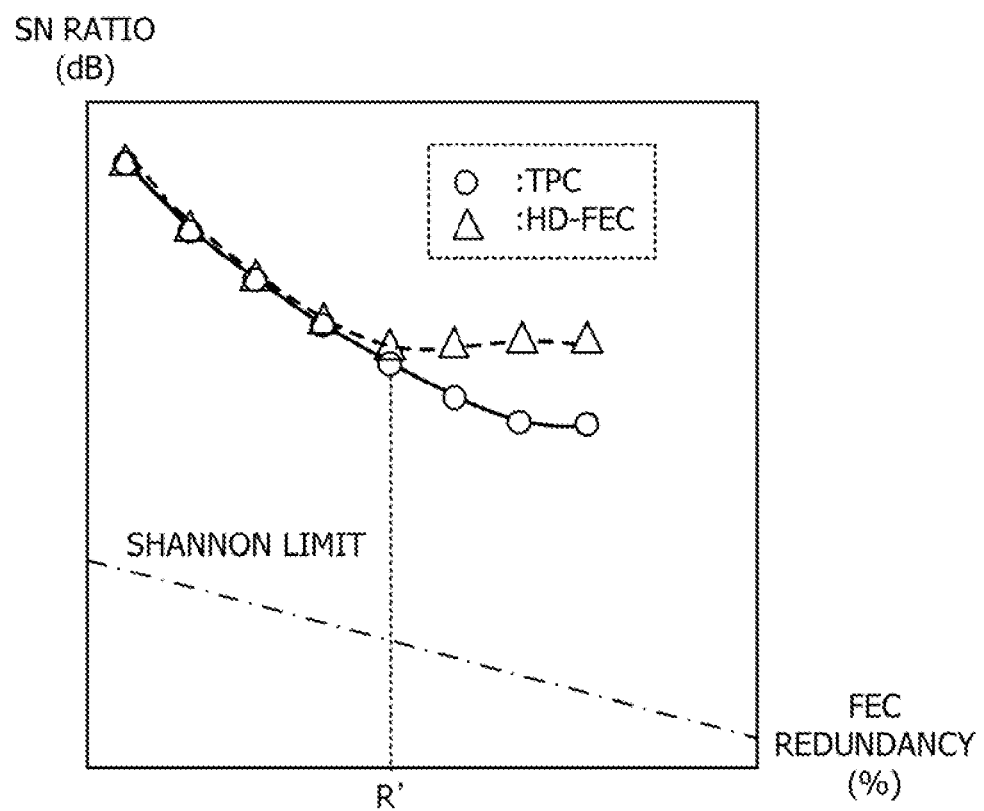
FIG. 7 is a graph of a simulation result indicating an example of improvement in error-correcting performance based on a turbo product code in the case of 32QAM.

Furthermore, FIG. 7 is a graph of a simulation result indicating an example of improvement in the error-correcting performance based on the turbo product code in the case of 32QAM. In FIG. 7, descriptions of contents common to FIG. 6 will be omitted. Here, the symbol mapping and the frame signal are as illustrated in FIG. 4.

As can be seen from FIG. 7, in the case of the turbo product code, as the FEC redundancy increases, the SN ratio decreases to approach the Shannon limit. On the other hand, in the case of the HD-FEC, while the SN ratio decreases to approach the Shannon limit as the FEC redundancy increases in the range of FEC redundancy predetermined value R', the SN ratio does not decrease but slightly increases in the range of FEC redundancy>predetermined value R'.

Therefore, even in the case of 32QAM, with the turbo product code used as the outer code, the error-correcting performance of the transmission device 2 improves.

Furthermore, as described with reference to FIG. 5, the SD-FEC decoder 42a calculates the log-likelihood ratio $L_0'$ of the bit string $x_0$ decoded on the basis of the soft decision result of the soft decision unit 41 and outputs it to the TPC decoder 40a, and the multistep soft decision unit 43a calculates the log-likelihood ratios $L_1$ to $L_3$ of the bit strings $x_1$ to $x_3$ and outputs them to the TPC decoder 40a. The TPC decoder 40a decodes the bit strings $x_1$ to $x_3$ on the basis of the log-likelihood ratios $L_0'$ and $L_1$ to $L_3$.

Accordingly, as compared with the case of performing the decoding using the hard decision values $b_0$ to $b_3$ of the bit strings $x_0$ to $x_3$ as in the comparative example, the TPC decoder 40a is enabled to perform the decoding highly accurately by using certainty of each value of the bit strings $x_0$ to $x_3$.

(Encoding Unit and Decoding Unit of Second Embodiment)

Figure 8:
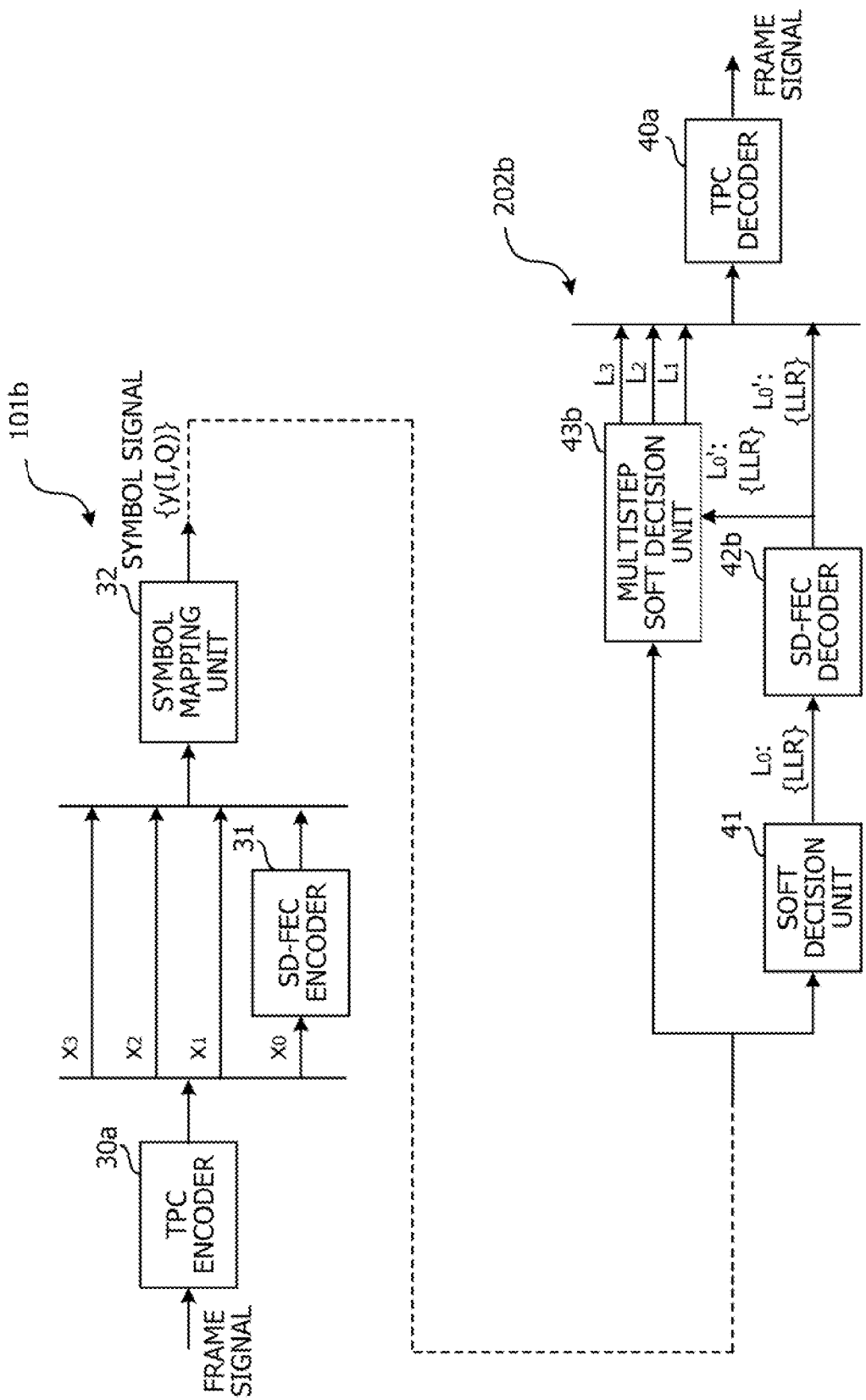
FIG. 8 is a configuration diagram illustrating an encoding unit and a decoding unit according to a second embodiment.

FIG. 8 is a configuration diagram illustrating an encoding unit 101b and a decoding unit 202b according to a second embodiment. In FIG. 8, components common to those in FIG. 5 are denoted by the same reference signs, and descriptions thereof will be omitted. The encoding unit 101b and the decoding unit 202b are provided in place of the encoding unit 101 and the decoding unit 202 according to the first embodiment, respectively.

The encoding unit 101b includes a TPC encoder 30a, an SD-FEC encoder 31, and a symbol mapping unit 32. The decoding unit 202b includes a TPC decoder 40a, a soft decision unit 41, an SD-FEC decoder 42b, and a multistep soft decision unit 43b.

In the first embodiment, while the multistep soft decision unit 43a calculates the individual log-likelihood ratios $L_1$ to $L_3$ of the bit strings $x_1$ to $x_3$ on the basis of the hard decision value $b_0$, reliability of the log-likelihood ratios $L_1$ to $L_3$ decreases in a case where the hard decision value $b_0$ is incorrect. In view of the above, the SD-FEC decoder 42b in the present example outputs a log-likelihood ratio $L_0'$ of a bit string $x_0$ to the multistep soft decision unit 43b, and the multistep soft decision unit 43b individually calculates each of the log-likelihood ratios $L_1$ to $L_3$ of bit strings $x_1$ to $x_3$ on the basis of the log-likelihood ratio $L_0'$ of the bit string $x_0$.

[Formula 4]

$$L_j = \log_2 \frac{P(x_j = 0 \mid y, L_0')}{P(x_j = 1 \mid y, L_0')} \quad (4)$$

As an example, the multistep soft decision unit 43b calculates a log-likelihood ratio $L_j$ (j=1, 2, or 3) according to the formula (4) set out above. In the formula (4), $P(x_j=0|y, L_0')$ indicates a probability that a value of a bit string $x_j$ is 0 on the premise of coordinates y (I, Q) of a signal point and the log-likelihood ratio $L_0$, and $P(x_j=1|y, L_0')$ indicates a probability that the value of the bit string $x_j$ is 1 in that case.

As described above, the multistep soft decision unit 43b calculates the log-likelihood ratios $L_1$ to $L_3$ by individually carrying out soft decision on the bit strings $x_1$ to $x_3$ on the basis of the log-likelihood ratio $L_0$, and outputs them to the TPC decoder 40a. Accordingly, the multistep soft decision unit 43b is enabled to calculate each of the log-likelihood ratios $L_1$ to $L_3$ according to certainty of the hard decision value $b_0$ by the log-likelihood ratio $L_0'$.

Furthermore, the multistep soft decision unit 43b may calculate the log-likelihood ratios $L_1$ to $L_3$ from the log-likelihood ratio with a smaller absolute value among the log-likelihood ratio $L_0'$ and the log-likelihood ratios $L_1$ to $L_3$ calculated from the formula (4) set out above.

However, in the present example, the log-likelihood ratio $L_0'$ is input from the SD-FEC decoder 42b to the multistep soft decision unit 43b instead of the hard decision value $b_0$ of the bit string $x_0$. Accordingly, the multistep soft decision unit 43b is not enabled to calculate the log-likelihood ratios $L_1$ to $L_3$ from the formula (3) on the basis of the hard decision value $b_0$.

[Formula 5]

$$l_j = \log_2 \frac{P(x_j = 0 \mid y, \text{sgn}(L_0'))}{p(x_j = 1 \mid y, \text{sgn}(L_0'))} \quad (5)$$

Therefore, the multistep soft decision unit 43b calculates a log-likelihood ratio $l_j$ from, instead of the formula (3), the formula (5) set out above on the basis of the log-likelihood ratio $L_0'$ and coordinates y (I, Q) of a symbol signal. Here, $\text{sgn}(L_0')$ represents a value of a sign function of the log-likelihood ratio $L_0'$. For example, in a case of $\text{sgn}(L_0')=1$, a possibility that the value of the bit string $x_0$ of the LSB is 0 is higher than a possibility that the value of the bit string $x_0$ is 1, and in a case of $\text{sgn}(L_0')=-1$, a possibility that the value of the bit string $x_0$ of the LSB is 1 is higher than a possibility that the value of the bit string $x_0$ is 0.

For example, $\text{sgn}(L_0')$ has meaning same as that of the hard decision value $b_0$ of the bit string $x_0$. Accordingly, the multistep soft decision unit 43b is enabled to calculate, using the formula (5), the log-likelihood ratios $L_1$ to $L_3$ same as those in the case of using the formula (3). Note that the log-likelihood ratio $I_j$ is an example of a third log-likelihood ratio of the bit strings $x_1$ to $x_3$ based on the hard decision value $b_0$ of the bit string $x_0$ of the LSB.

[Formula 6]

$$L_j \, \text{sgn}(I_j)\min(|I_j|,|L_0'|) \qquad (6)$$

The multistep soft decision unit 43b calculates the log-likelihood ratio $L_j$ (j=1, 2, or 3) from the formula (6) set out above. Here, $\min(|I_j|, |L_0'|)$ represents a smaller value of $|I_j|$ and $|L_0'|$. Furthermore, $\text{sgn}(I_j)$ indicates a positive or negative sign (±1) of the log-likelihood ratio $I_0$.

As described above, the multistep soft decision unit 43b calculates the log-likelihood ratios $L_1$ to $L_3$ from, of the log-likelihood ratio $L_0'$ and the log-likelihood ratio $I_j$ obtained from the formula (5), the log-likelihood ratio with the smaller absolute value, and outputs them to the TPC decoder 40a. Accordingly, the multistep soft decision unit 43b is enabled to decrease the log-likelihood ratios $L_1$ to $L_3$ in a case where the certainty of the hard decision value $b_0$ by the log-likelihood ratio $L_0'$ is low.

Moreover, the multistep soft decision unit 43b may calculate the log-likelihood ratio $L_j$ according to the reliability of the hard decision value $b_0$ of the bit string $x_0$.

[Formula 7]

$$I_j^c = \log_2 \frac{P(x_j = 0 \mid y, -\text{sgn}(L_0'))}{P(x_j = 1 \mid y, -\text{sgn}(L_0'))} \qquad (7)$$

In this case, the multistep soft decision unit 43b calculates a log-likelihood ratio $I_j^c$ (j=1, 2, or 3) of the bit strings $x_1$ to $x_3$ based on a hard decision value $(-\text{sgn}(L_0'))$ in which the positive or negative sign of the hard decision value of the log-likelihood ratio $L_0'$ is inverted from the formula (7) set out above. As described above, since $\text{sgn}(L_0')$ has the meaning same as that of the hard decision value $b_0$ of the bit string $x_0$, the hard decision value $(-\text{sgn}(L_0'))$ in which the positive or negative sign is inverted is an intentionally misled value of the hard decision value $b_0$. Note that the log-likelihood ratio $I_j^c$ is an example of a fourth log-likelihood ratio of the bit strings $x_1$ to $x_3$ based on the hard decision value in which the positive or negative sign of the hard decision value of the log-likelihood ratio $L_0'$ is inverted.

For example, in the case of $\text{sgn}(L_0')=1$, for example, assuming that the possibility that the value of the bit string $x_0$ of the LSB is 0 is higher than the possibility that the value of the bit string $x_0$ is 1, the hard decision value $(-\text{sgn}(L_0')=-1)$ in which the positive or negative sign is inverted indicates that the possibility that the value of the bit string $x_0$ is 1 is taken into consideration. Accordingly, the log-likelihood ratio $I_j^c$ of the bit strings $x_1$ to $x_3$ is calculated on the premise that the value of the bit string $x_0$ is 1. Meanwhile, the log-likelihood ratio $I_j$ of the bit strings $x_1$ to $x_3$ is calculated on the premise that the value of the bit string $x_0$ is 0 on the basis of the formula (5) set out above.

[Formula 8]

$$L_j = \begin{cases} I_j, & \text{sgn}(I_j) = \text{sgn}(I_j^c) \\ \text{sgn}(I_j)\min(|I_j|, |L_0'|), & \text{sgn}(I_j) \neq \text{sgn}(I_j^c) \end{cases} \qquad (8)$$

The multistep soft decision unit 43b calculates the log-likelihood ratio $L_j$ (j=1, 2, or 3) from the formula (8) set out above. In a case where $\text{sgn}(I_j)=\text{sgn}(I_j^c)$ is satisfied, the multistep soft decision unit 43b calculates the log-likelihood ratio $I_j$ from the formula (5) set out above as the log-likelihood ratio $L_j$. Furthermore, in a case where $\text{sgn}(I_j) \neq \text{sgn}(I_j^c)$ is satisfied, the multistep soft decision unit 43b calculates the log-likelihood ratio $L_j$ from the formula (6) set out above. Here, $\text{sgn}(I_j)$ indicates a positive or negative sign of the log-likelihood ratio $I_j$, and $\text{sgn}(I_j^c)$ indicates a positive or negative sign of the log-likelihood ratio $I_j^c$. The multistep soft decision unit 43b determines whether or not $\text{sgn}(I_j)=\text{sgn}(I_j^c)$ is satisfied for each of the bit strings $x_1$ to $x_3$ (e.g., variable j).

In the case where $\text{sgn}(I_j)=\text{sgn}(I_j^c)$ is satisfied, the certainty that the value of the bit strings $x_1$ to $x_3$ is one of 0 and 1 exceeds the certainty that it is the other one of 0 and 1 regardless of whether the value of the bit string $x_0$ is 0 or 1. Taking the constellation in FIG. 3 as an example, regardless of whether the coordinates of the signal point P on the transmitting side match the symbol S7 (white circle) in which the bit string $x_0$ is 0 or the symbol S8 (black circle) in which the bit string $x_0$ of the LSB is 1, the values of other bit strings $x_1$ to $x_3$ are 0. In such a case, $\text{sgn}(I_j)=\text{sgn}(I_j^c)$ is satisfied.

Therefore, in this case, the multistep soft decision unit 43b determines the log-likelihood ratio $I_j$ as a value with high reliability, and outputs it to the TPC decoder 40a as the log-likelihood ratio $L_j$.

Meanwhile, in the case where $\text{sgn}(I_j) \neq \text{sgn}(I_j^c)$ is satisfied, which of 0 and 1 is more likely to be the value of the bit strings $x_1$ to $x_3$ is determined depending on whether the value of the bit string $x_0$ is 0 or 1. Taking the constellation in FIG. 3 as an example, while the value of the bit string $x_1$ is 1 in a case where the coordinates of the signal point P on the transmitting side match the symbol S4 (white circle) in which the bit string $x_0$ is 0, the value of the bit string $x_1$ is 0 in a case of matching the symbol S8 (black circle) in which the bit string $x_0$ of the LSB is 1. For example, the value of the bit string $x_1$ differs depending on whether the value of the bit string $x_0$ is 0 or 1.

Therefore, in this case, the multistep soft decision unit 43b determines the log-likelihood ratio $I_j$ as a value with low reliability, and calculates the log-likelihood ratio $L_j$ from the formula (6) set out above to output it to the TPC decoder 40a.

As described above, in a case where the positive and negative signs of the log-likelihood ratio $I_j$ and the log-likelihood ratio $I_j^c$ match with each other, the multistep soft decision unit 43b calculates the log-likelihood ratio $L_j$ from the log-likelihood ratio $I_j$, and outputs it to the TPC decoder 40a. Furthermore, in a case where the positive and negative signs of the log-likelihood ratio $I_j$ and the log-likelihood ratio $I_j^c$ do not match with each other, the multistep soft decision unit 43b calculates the log-likelihood ratios $L_1$ to $L_3$ from the log-likelihood ratio with the lower absolute value among the log-likelihood ratio $I_j$ and the log-likelihood ratio $L_0$, and outputs them to the TPC decoder 40a.

Therefore, the multistep soft decision unit 43b is enabled to appropriately calculate the log-likelihood ratios $L_1$ to $L_3$ to be output to the TPC decoder 40a according to the reliability of the log-likelihood ratio $I_j$.

(Encoding Unit and Decoding Unit of Third Embodiment)

Figure 9:
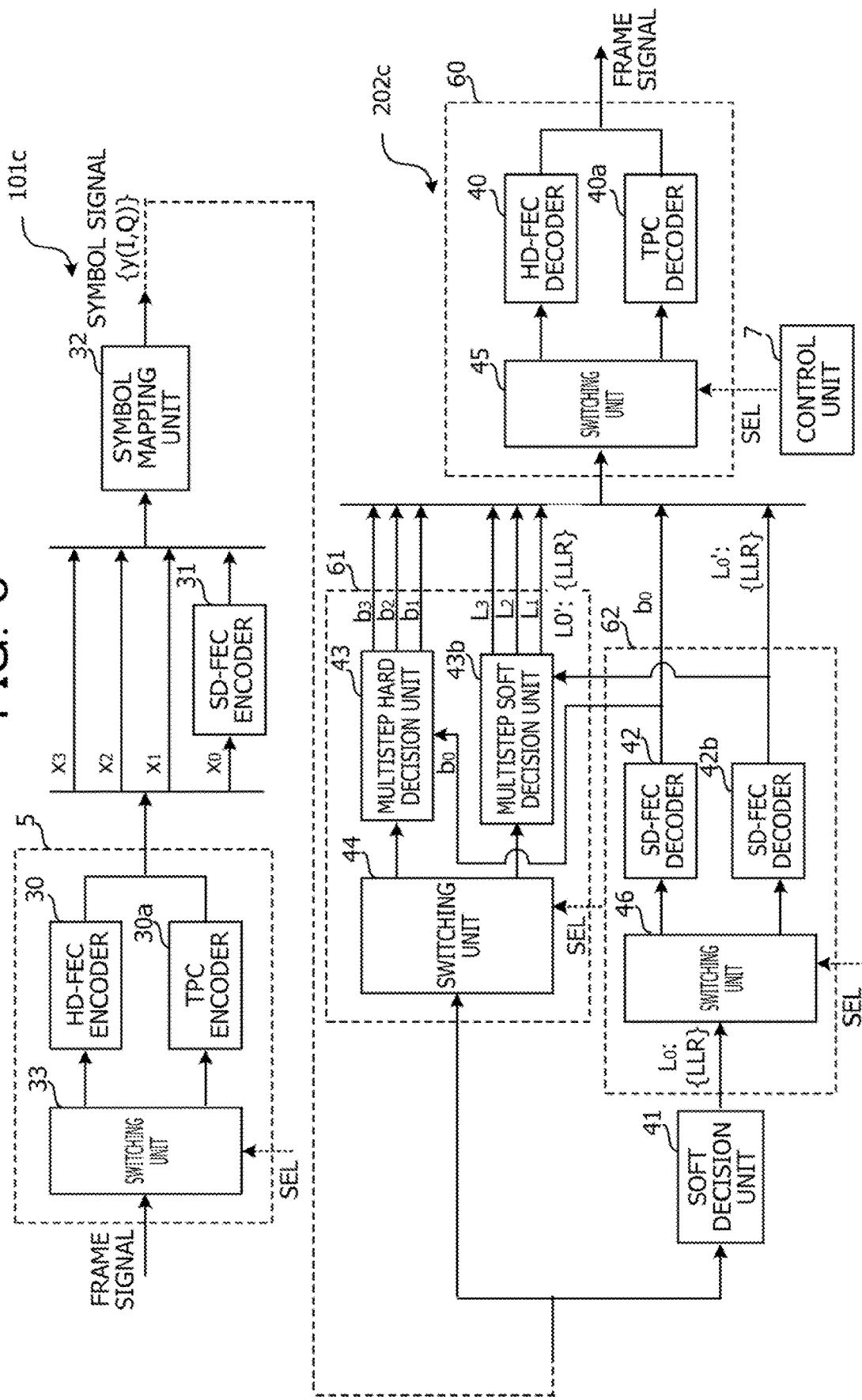
FIG. 9 is a configuration diagram illustrating an encoding unit and a decoding unit according to a third embodiment.

FIG. 9 is a configuration diagram illustrating an encoding unit 101c and a decoding unit 202c according to a third embodiment. In FIG. 9, components common to those in FIGS. 2 and 8 are denoted by the same reference signs, and descriptions thereof will be omitted. The encoding unit 101c and the decoding unit 202c include both of the encoding unit 101 and the decoding unit 202 in the comparative example and the encoding unit 101b and the decoding unit 202b in the second embodiment. The encoding unit 101c and the decoding unit 202c are provided in place of the encoding unit 101 and the decoding unit 202, respectively.

The encoding unit 101c includes an encoding processing unit 5, an SD-FEC encoder 31, and a symbol mapping unit 32. The encoding processing unit 5 includes an HD-FEC encoder 30, a TPC encoder 30a, and a switching unit 33.

The decoding unit 202c includes an outer code processing unit 60, an MLC processing unit 61, an inner code processing unit 62, a soft decision unit 41, and a control unit 7. The soft decision unit 41 is an example of a first determination unit that carries out soft decision of a value of a bit string $x_0$ of the LSB from a symbol signal.

The MLC processing unit 61 includes a switching unit 44, a multistep hard decision unit 43, and a multistep soft decision unit 43b. The MLC processing unit 61 is an example of a second determination unit that individually carries out soft decision or hard decision of values of bit strings $x_1$ to $x_3$ from the symbol signal.

The inner code processing unit 62 includes a switching unit 46 and SD-FEC decoders 42 and 42b. The inner code processing unit 62 is an example of a first decoding unit that decodes the bit string $x_0$ of the LSB with a soft decision code on the basis of a soft decision result of the soft decision unit 41.

The outer code processing unit 60 includes a switching unit 45, an HD-FEC decoder 40, and a TPC decoder 40a. The outer code processing unit 60 is an example of a second decoding unit that decodes the bit strings $x_0$ to $x_3$ on the basis of a result of decoding by the inner code processing unit 62 and a result of soft decision or hard decision of the MLC processing unit 61.

The control unit 7 selects an outer code from a BCH product code (hard decision code) and a turbo product code according to an instruction from a network monitoring control device (not illustrated), for example. The control unit 7 outputs a selection signal SEL indicating a selection result of the outer code to the individual switching units 33 and 44 to 46. Note that the control unit 7 may be provided in the encoding unit 101c, or may be provided outside the signal processing circuits 10 and 20.

The switching unit 33 switches an output destination of a frame signal to the HD-FEC encoder 30 or the TPC encoder 30a according to the selection signal SEL from the control unit 7. The switching unit 33 outputs the frame signal to the HD-FEC encoder 30 in a case where the selection signal SEL indicates the BCH product code, and outputs the frame signal to the TPC encoder 30a in a case where the selection signal SEL indicates the turbo product code. As described above, the switching unit 33 switches the code used for the encoding process of the outer code between the BCH product code (hard decision code) and the turbo product code.

The switching unit 44 switches the output destination of the symbol signal to the multistep hard decision unit 43 or the multistep soft decision unit 43b according to the selection signal SEL from the control unit 7. The switching unit 44 outputs the symbol signal to the multistep hard decision unit 43 in the case where the selection signal SEL indicates the BCH product code, and outputs the symbol signal to the multistep soft decision unit 43b in the case where the selection signal SEL indicates the turbo product code.

The switching unit 46 switches an output destination of a log-likelihood ratio $L_0$ input from the soft decision unit 41 to one of the SD-FEC decoders 42 and 42b according to the selection signal SEL from the control unit 7. The switching unit 46 outputs the log-likelihood ratio $L_0$ to the SD-FEC decoder 42 in the case where the selection signal SEL indicates the BCH product code. When the log-likelihood ratio $L_0$ is input, the SD-FEC decoder 42 outputs a hard decision value $b_0$ to the multistep hard decision unit 43 and the switching unit 45.

Furthermore, the switching unit 46 outputs the log-likelihood ratio $L_0'$ to the SD-FEC decoder 42b in the case where the selection signal SEL indicates the turbo product code. When the log-likelihood ratio $L_0$ is input, the SD-FEC decoder 42b outputs a log-likelihood ratio $L_0'$ to the multistep soft decision unit 43b and the switching unit 45.

The switching unit 45 switches, according to the selection signal SEL from the control unit 7, an output destination of input signals from the multistep hard decision unit 43 and the multistep soft decision unit 43b and input signals from the SD-FEC decoders 42 and 42b to the HD-FEC decoder 40 or the TPC decoder 40a. In the case where the selection signal SEL indicates the BCH product code, the switching unit 45 outputs, to the HD-FEC decoder 40, hard decision values $b_1$ to $b_3$ input from the multistep hard decision unit 43 and the hard decision value $b_0$ input from the SD-FEC decoder 42.

There is a circuit configuration of the TPC decoder 40a common to a circuit configuration of the HD-FEC decoder 40. Accordingly, even in a case where the outer code processing unit 60 has a configuration in which the TPC decoder 40a and the HD-FEC decoder 40 are switchable as in the present example, it may be achieved with a circuit scale approximately the same as that in the case of including only the TPC decoder 40a.

Furthermore, in the case where the selection signal SEL indicates the turbo product code, the switching unit 45 outputs log-likelihood ratios $L_1$ to $L_3$ input from the multistep soft decision unit 43b and the log-likelihood ratio $L_0'$ input from the SD-FEC decoder 42b to the TPC decoder 40a. As described above, the switching unit 45 switches the code used for the decoding process of the outer code between the BCH product code (hard decision code) and the turbo product code.

In the present example, the bit strings $x_0$ to $x_3$ are subject to the encoding of the outer code based on the turbo product code or the hard decision code and to the encoding of the inner code based on the soft decision code. The outer code processing unit 60 decodes the bit strings $x_0$ to $x_3$ with the turbo product code in a case where the bit strings $x_0$ to $x_3$ have been subject to the encoding of the outer code based on the turbo product code, and decodes the bit strings $x_0$ to $x_3$ with the BCH product code in a case where the bit strings $x_0$ to $x_3$ have been subject to the encoding of the outer code based on the BCH product code.

Accordingly, the encoding unit 101c and the decoding unit 202c switch the type of the outer code depending on a multi-level modulation method and a transmission distance of an optical signal, whereby it becomes possible to improve transmission quality. For example, it becomes possible to appropriately select the type of the outer code depending on whether the transmission devices 1 and 2 are used for medium-to-long-distance communication such as communication between cities or used for short-distance communication such as communication between data centers.

A low multi-level modulation method is used in the medium-to-long-distance communication. In that case, it is possible to perform code error correcting with the HD-FEC with low power consumption as the outer code, and the control unit 7 selects the HD-FEC as the outer code.

On the other hand, a high multi-level modulation method is used in the short-distance communication. In that case, code errors may not be sufficiently corrected if the outer code is the HD-FEC, and thus the control unit 7 selects the TPC with high correction capability. Therefore, the control unit 7 outputs the selection signal SEL indicating the turbo product code in a case where the multi-level degree of the multi-level modulation method used for the bit strings $x_0$ to $x_3$ in the symbol mapping unit 32 is equal to or higher than a predetermined value, and outputs the selection signal SEL indicating the BCH product code in a case where the multi-level degree of the multi-level modulation method is less than the predetermined value.

While the value input from the MLC processing unit 61 and the inner code processing unit 62 to the outer code processing unit 60 is switched to the hard decision values $b_0$ to $b_3$ or the log-likelihood ratios $L_0'$ and $L_1$ to $L_3$ as the control unit 7 outputs the selection signal SEL to the switching unit 45 in the present example, this switching is not necessarily performed. For example, even in a case where the log-likelihood ratios $L_0'$ and $L_1$ to $L_3$ are input to the HD-FEC decoder 40, the HD-FEC decoder 40 may normally execute the decoding process by converting the log-likelihood ratios $L_0'$ and $L_1$ to $L_3$ into a hard decision value of +1 or −1 by the sign function sgn described above.

Furthermore, the encoding unit 101c and the decoding unit 202c may include the encoding unit 101 and the decoding unit 202 according to the first embodiment in place of the encoding unit 101b and the decoding unit 202b according to the second embodiment. In this case, the MLC processing unit 61 includes the switching unit 44, the multistep hard decision unit 43, and the multistep soft decision unit 43a, and the inner code processing unit 62 includes the switching unit 46 and the SD-FEC decoders 42 and 42a. With this configuration as well, in a similar manner to the above, the encoding unit 101c and the decoding unit 202c may switch the type of the outer code.

The embodiments described above are examples of a preferred embodiment. However, they are not limited thereto, and a variety of modifications may be made without departing from the gist of the embodiments.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A signal processing device comprising:
   a memory; and
   a processor coupled to the memory and configured to:
   perform soft decision of a value of, among a plurality of bit strings, a predetermined bit string encoded with a soft decision code from a symbol assigned to, according to each value of the plurality of bit strings, the plurality of bit strings having been subject to encoding of an outer code with a turbo product code and encoding of an inner code with the soft decision code;
   decode the predetermined bit string with the soft decision code on a basis of a result of the soft decision;
   individually perform, from the symbol, the soft decision of a value of each bit string other than the predetermined bit string among the plurality of bit strings; and
   decode the plurality of bit strings with the turbo product code on a basis of a result of the decoding and a result of the soft decision.

2. The signal processing device according to claim 1, wherein the processor:
   calculates a first log-likelihood ratio of the predetermined bit string decoded on the basis of the result of the soft decision,
   calculates a second log-likelihood ratio of the bit string other than the predetermined bit string, and
   the plurality of bit strings on a basis of the first log-likelihood ratio and the second log-likelihood ratio.

3. The signal processing device according to claim 2, wherein the processor:
   calculates the second log-likelihood ratio by individually performing the soft decision of the bit string other than the predetermined bit string among the plurality of bit strings on a basis of the first log-likelihood ratio.

4. The signal processing device according to claim 3, wherein the processor:
   calculate a third log-likelihood ratio of the bit string other than the predetermined bit string based on the first log-likelihood ratio and a hard decision value of the predetermined bit string; and
   calculate the second log-likelihood ratio from, of the first log-likelihood ratio and the third log-likelihood ratio, a log-likelihood ratio with a lower absolute value.

5. The signal processing device according to claim 4, wherein the processor:
   calculates a fourth log-likelihood ratio of the bit string other than the predetermined bit string based on a hard decision value in which a positive or negative sign of a hard decision value of the third log-likelihood ratio is inverted;
   in a case where individual positive or negative signs of the third log-likelihood ratio and the fourth log-likelihood ratio match and calculates the second log-likelihood ratio from the third log-likelihood ratio; and
   in a case where the individual positive or negative signs of the third log-likelihood ratio and the fourth log-likelihood ratio do not match, calculates the second log-likelihood ratio from, of the first log-likelihood ratio and the third log-likelihood ratio, the log-likelihood ratio with the lower absolute value.

6. A signal processing device comprising:
   a memory; and
   a processor coupled to the memory and configured to:
   perform soft decision of a value of, among a plurality of bit strings, a predetermined bit string encoded with a soft decision code from a symbol assigned to, according to each value of the plurality of bit strings, the plurality of bit strings having been subject to encoding of an outer code with a turbo product code or a hard decision code and encoding of an inner code with the soft decision code;

decode the predetermined bit string with the soft decision code on a basis of a result of the soft decision;

individually perform, from the symbol, the soft decision of a value of each bit string other than the predetermined bit string among the plurality of bit strings; and decode the plurality of bit strings on a basis of a result of the decoding and a result of the soft decision or hard decision;

in a case where the plurality of bit strings has been subject to the encoding of the outer code with the turbo product code, decode the plurality of bit strings with the turbo product code; and in a case where the plurality of bit strings has been subject to the encoding of the outer code with the hard decision code, decode the plurality of bit strings with the hard decision code.

7. The signal processing device according to claim 6, wherein the processor:

decodes the plurality of bit strings with the turbo product code in a case where a multi-level degree of a multi-level modulation method used for the plurality of bit strings is equal to or higher than a predetermined value, and decodes the plurality of bit strings with the hard decision code in a case where the multi-level degree of the multi-level modulation method is less than the predetermined value.

8. A transmission device comprising:

a memory; and a processor coupled to the memory and configured to:

receive a symbol assigned to, according to each value of a plurality of bit strings, the plurality of bit strings having been subject to encoding of an outer code with a turbo product code and encoding of an inner code with a soft decision code;

perform soft decision of a value of, among the plurality of bit strings, a predetermined bit string encoded with the soft decision code from the symbol;

decode the predetermined bit string with the soft decision code on a basis of a result of the soft decision;

individually perform, from the symbol, the soft decision of a value of each bit string other than the predetermined bit string among the plurality of bit strings; and decode the plurality of bit strings with the turbo product code on a basis of a result of the decoding and a result of the soft decision.

9. The transmission device according to claim 8, wherein the processor:

calculates a first log-likelihood ratio of the predetermined bit string decoded on the basis of the result of the soft decision, calculates a second log-likelihood ratio of the bit string other than the predetermined bit string, and the plurality of bit strings on a basis of the first log-likelihood ratio and the second log-likelihood ratio.

10. The transmission device according to claim 9, wherein the processor:

calculates the second log-likelihood ratio by individually performing the soft decision of the bit string other than the predetermined bit string among the plurality of bit strings on a basis of the first log-likelihood ratio.

11. The transmission device according to claim 10, wherein the processor:

calculate a third log-likelihood ratio of the bit string other than the predetermined bit string based on the first log-likelihood ratio and a hard decision value of the predetermined bit string; and calculate the second log-likelihood ratio from, of the first log-likelihood ratio and the third log-likelihood ratio, a log-likelihood ratio with a lower absolute value.

12. The transmission device according to claim 11, wherein the processor:

calculates a fourth log-likelihood ratio of the bit string other than the predetermined bit string based on a hard decision value in which a positive or negative sign of a hard decision value of the third log-likelihood ratio is inverted;

in a case where individual positive or negative signs of the third log-likelihood ratio and the fourth log-likelihood ratio match and calculates the second log-likelihood ratio from the third log-likelihood ratio; and in a case where the individual positive or negative signs of the third log-likelihood ratio and the fourth log-likelihood ratio do not match, calculates the second log-likelihood ratio from, of the first log-likelihood ratio and the third log-likelihood ratio, the log-likelihood ratio with the lower absolute value.

* * * * *